(12) United States Patent
Choo et al.

(10) Patent No.: US 10,033,427 B2
(45) Date of Patent: Jul. 24, 2018

(54) TRANSMITTER LOCAL OSCILLATOR LEAKAGE SUPPRESSION

(71) Applicant: Texas Instruments Incorporated, Dallas, TX (US)

(72) Inventors: Hunsoo Choo, Plano, TX (US); Nikolaus Klemmer, Plano, TX (US); Jaiminkumar Mehta, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/737,191

(22) Filed: Jun. 11, 2015

(65) Prior Publication Data

US 2015/0365128 A1 Dec. 17, 2015

Related U.S. Application Data

(60) Provisional application No. 62/010,804, filed on Jun. 11, 2014.

(51) Int. Cl.
| H04B 1/46 | (2006.01) |
| H04B 1/525 | (2015.01) |
| H03D 3/00 | (2006.01) |
| H04B 1/30 | (2006.01) |

(52) U.S. Cl.
CPC .......... *H04B 1/525* (2013.01); *H03D 3/008* (2013.01); *H04B 1/30* (2013.01)

(58) Field of Classification Search
CPC .......... H04B 3/23; H04B 1/006; H04B 1/109; H04B 1/123; H04B 7/0413; H04B 7/10; H01Q 21/00; H01Q 3/2605; H04L 5/1423

USPC ........ 455/91, 93, 141.1, 126, 310, 317, 318, 455/371; 370/286, 287
See application file for complete search history.

(56) References Cited

U.S. PATENT DOCUMENTS

| 8,676,143 | B2* | 3/2014 | Thomas ................ H04B 1/006 370/286 |
| 8,837,332 | B2* | 9/2014 | Khojastepour ...... H01Q 3/2605 370/201 |
| 2003/0109241 | A1* | 6/2003 | Kim ........................ H03D 3/008 455/324 |
| 2005/0143028 | A1* | 6/2005 | Zheng .................... H03D 3/008 455/127.1 |
| 2010/0048146 | A1* | 2/2010 | McCallister ........... H04B 1/525 455/78 |

(Continued)

*Primary Examiner* — Edward Urban
*Assistant Examiner* — Max Mathew
(74) *Attorney, Agent, or Firm* — Andrew Viger; Charles A. Brill; Frank D. Cimino (57) ABSTRACT

A system for reducing a local oscillator leakage component. The system includes a transmitter channel to transmit data modulated using a transmitter local oscillator frequency. A transmitted signal includes a transmitter local oscillator leakage component. The system also includes a receiver channel to receive the transmitted signal using a receiver local oscillator signal having a frequency offset from the transmitter local oscillator frequency. The received signal includes the transmitter local oscillator leakage component isolated from one or more receiver impairments. The system further includes a feedback loop from the receiver channel to the transmitter channel to identify a power of the isolated transmitter local oscillator leakage component and to generate a local oscillator leakage cancellation signal based on the identified power.

20 Claims, 5 Drawing Sheets

(56) References Cited

U.S. PATENT DOCUMENTS

| | | | |
|---|---|---|---|
| 2013/0266045 A1* | 10/2013 | Lakkis | H04B 1/30 375/219 |
| 2014/0226738 A1* | 8/2014 | Plevel | H04L 25/063 375/261 |
| 2014/0232468 A1* | 8/2014 | Hulbert | H04B 1/0475 330/293 |
| 2015/0381228 A1* | 12/2015 | Milenkovic | H04B 17/12 375/219 |

* cited by examiner

TRANSMITTER LOCAL OSCILLATOR LEAKAGE SUPPRESSION

CROSS-REFERENCE TO RELATED APPLICATIONS

The present application claims priority to U.S. Provisional Patent Application No. 62/010,804, filed Jun. 11, 2014, titled "TX Carrier Leakage Suppression with High Resolution by Separating Impairments from the Receive Path," which is hereby incorporated herein by reference in its entirety.

BACKGROUND

Wireless devices, such as wireless base stations, transmit data by modulating that data with a local oscillator clock signal, for example a 2 GHz square wave. Once a data signal is multiplied with the local oscillator clock signal, the modulated signal is amplified and sent to an antenna for transmission or broadcasting. However, the multiplication between the local oscillator signal and the data signal can be imperfect and a portion of the local oscillator clock signal leaks to the output of the up-converter block; this is referred to as local oscillator leakage.

Unfortunately, the presence of local oscillator leakage in a transmitted signal can cause the transmission to become corrupted on the receiver side, for example a mobile device receiving a signal from the wireless base station. The local oscillator leakage is a type of impairment to adjacent channels on which the modulated signal is transmitted. Thus, it is desirable to reduce transmission of the unmodulated clock signal, or local oscillator leakage, to reduce impairments in adjacent channels.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

As explained above, the presence of local oscillator leakage in a transmitted signal can cause the transmission to become corrupted on the receiver side. For example, when the successfully modulated signal is near the unmodulated leakage from the local oscillator, the modulated signal is corrupted. This may corrupt a channel to one or more other mobile devices than that which the signal is intended. The impairments to nearby channels created by local oscillator leakage interfere with transmissions in those channels and can impair overall system performance. It is thus desirable for local oscillator leakage to be on the order of 70 dB below the transmitted signal power, and sometimes even lower.

Figure 1:
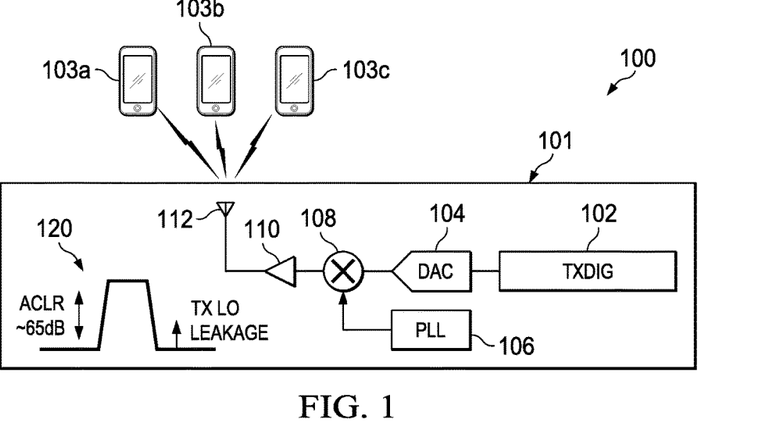
FIG. 1 shows a block diagram of a transmitter channel in accordance with various examples.
Figure 2:
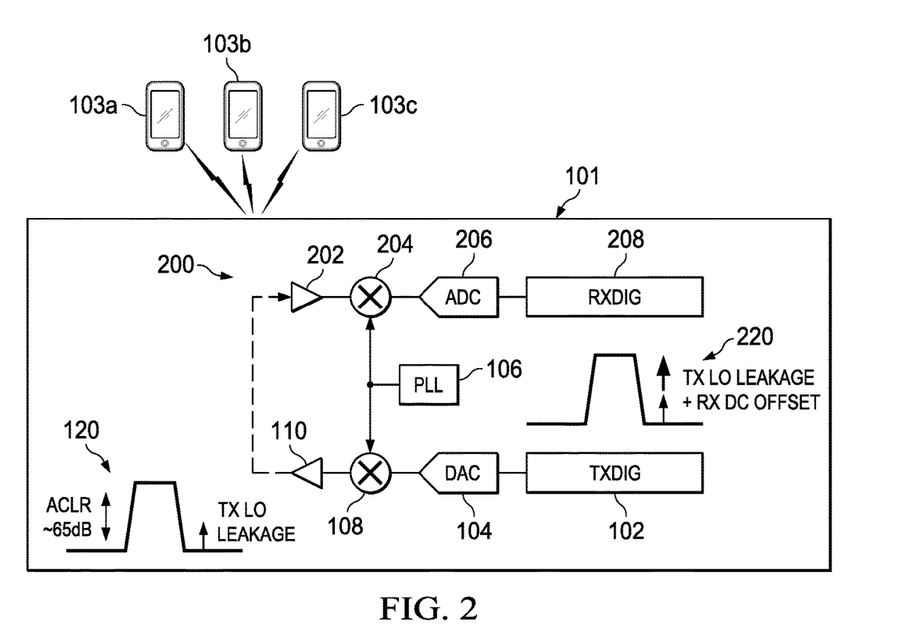
FIG. 2 shows a block diagram of a radio transceiver including a transmitter channel and a receiver channel in accordance with various examples.

FIGS. 1 and 2 illustrate the problems described above. FIG. 1 shows a transmitter channel 100, for example employed as part of an integrated radio transceiver in a wireless or cellular base station or access point 101. The base station or access point 101 may couple to one or more wireless devices 103a-c. The transmitter channel 100 includes a data generation and processing component 102, which generates data to be transmitted. The data is in turn sent to a digital-to-analog converter (DAC) 104, which produces an analog voltage that corresponds to the low frequency base band data signal. A local oscillator 106, which may be a phase-locked loop (PLL) for example, generates a clock signal (e.g., a square wave) at a carrier frequency (e.g., 2 GHz). An up-converter block 108 multiples the analog voltage produced by the DAC 104 with the local oscillator signal produced by the PLL 106 to produce a modulated signal, which is fed to a power amplifier 110 prior to being broadcast using an antenna 112.

As explained above, the up-converter block 108 may be implemented using semiconductor devices (e.g., MOS switching transistors) that contain parasitic coupling between the switching nodes, resulting in an unmodified (e.g., not multiplied with the analog voltage produced by DAC 104) local oscillator signal being passed to the power amplifier 110. This leakage is represented by a frequency plot 120, which shows a spurious, un-modulated signal component (labeled TX LO) at the frequency of the local oscillator signal, adjacent to the transmitted channel signal. Other impairments exist in the transmitter implementation that are difficult to minimize in practice (e.g., amplifier non-linear distortion). Therefore, the adjacent channel leakage ratio (ACLR) (i.e., the ratio of adjacent channel to on-channel transmit power) is not zero, even in the absence of local oscillator leakage. In a zero IF example, the local oscillator leakage component 120 may reside at the center of the transmitted channel signal. In accordance with certain disclosed examples, local oscillator leakage is reduced such that it does not substantially contribute to the total on-channel, adjacent channel, or off-channel transmit power requirements, which may be application-dependent.

Turning to FIG. 2, the transmitter channel 100 of FIG. 1 is reproduced; however, in FIG. 2, a receiver channel 200 is shown whose input is coupled to the output of the transmitter channel, such that the receiver channel 200 receives a transmitted signal from the transmitter channel 100. The elements of the receiver channel 200 are similar to those in the transmitter channel 100, although in reverse sequence. For example, attenuator and mixer driving block 202 receives and attenuates a transmitted signal and provides its output to a down-converter block 204. The down-converter block performs a receiver RF mixing operation to produce analog receiver output baseband data signals. In prior systems, the PLL 106 is shared among both the transmitter up-converter block 108 and the receiver down-converter block 204.

The analog receiver output baseband data signals produced by the down-converter block 204 are provided to analog-to-digital converter (ADC) 206, which converts these signals to digital data. The remaining receiver functionality is represented by block 208, which passes the received digital data for use elsewhere in the system (i.e., de-channelization, de-modulation, and subsequent signal processing).

It should be appreciated that the receiver channel 200 is not perfectly linear, but rather possesses a transfer function that includes both a linear gain and various non-linear components (e.g., including a second-order non-linearity that produces an output signal from the squared input signal). When an oscillating input is squared, the resulting output includes only positive values, and thus the receiver channel 200 ascribes a direct current (DC) voltage offset in its data path. However, because the same PLL 106 is used for both the transmitter channel 100 and the receiver channel 200, the DC offset is added on top of the local oscillator leakage component 120 of the transmitted signal. This is represented by the additive components in the frequency plot 220.

A common way that the local oscillator leakage component 120 may be reduced is by applying a one-time calibration in which the local oscillator leakage component 120 is negated or cancelled during a calibration procedure (e.g., using on-chip logic or external equipment) before operation of the system 100, 200 begins. However, operating temperature has a strong influence on the local oscillator leakage component 120, and thus a one-time calibration procedure will not adequately address the drift in the local oscillator leakage component 120 that occurs when operating temperatures or other operating conditions change.

Another way that the local oscillator leakage component 120 may be reduced is by attempting to estimate and cancel the signal, for example through a feedback path from the receiver channel 200 to the transmitter channel 100. However, because the DC level seen at the receiver channel 200 output is a composite of both the receiver DC offset and the local oscillator leakage component 120 from the transmitter channel, complex signal processing is required to isolate the transmitter local oscillator leakage component 120 to effectively cancel or negate that component going forward. Alternately, an attempt may be made to eliminate the DC offset introduced by the receiver data path. A very high resolution is required, or else the receiver DC offset will be applied to future cancellation of the transmitter local oscillator leakage component 120, effectively retransmitting receiver DC offset in form of a fixed local oscillator signal at the transmitter output, negating the intent of minimizing transmission power at the local oscillator signal frequency. In addition to impractically-high resolution being required, a very accurate estimation of the DC offset is required, which results in the need for impractically-long estimation durations in the presence of a simultaneously ongoing transmission of noise, rendering this method less useful in real world conditions.

Thus, it can be seen that the cancellation of the transmitter local oscillator leakage component 120 is both a difficult and a time-consuming process when calibration accuracies are required above what can be achieved with a one-time adjustment, or when adjustment is required to be performed continuously as a background operation, without interfering with an ongoing transmission.

Figure 3:
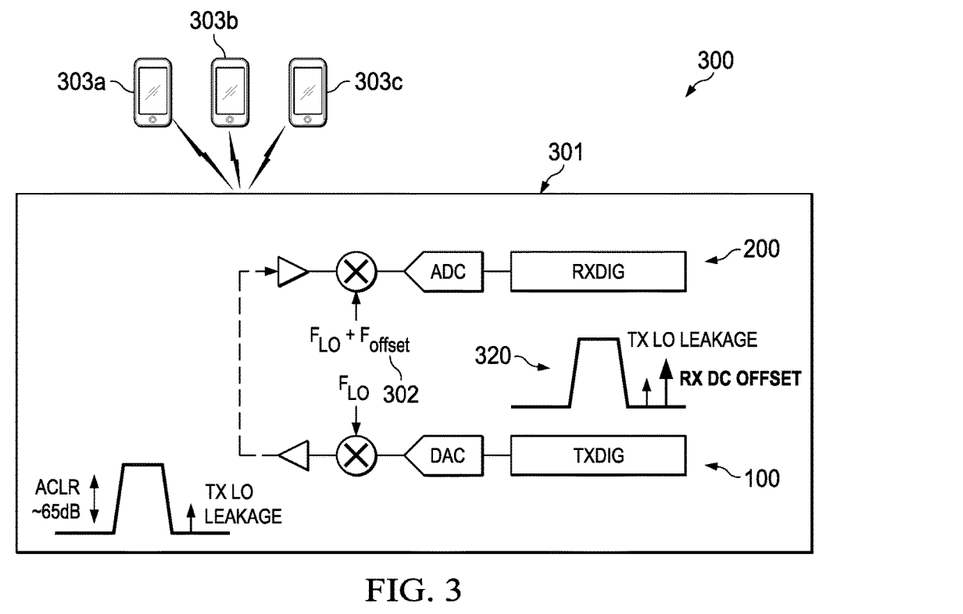
FIG. 3 shows a block diagram of another radio transceiver in accordance with various examples.

Turning now to FIG. 3, a system 300 is shown in accordance with various examples of the present disclosure. The system 300 includes a wireless base station or access point 301 having a transmitter channel 100 and a receiver channel 200. The base station or access point 301 may couple to one or more wireless devices 303*a-c*. In particular, the base station or access point 301 is one in which the local oscillator frequency used by the receiver channel 200 is offset 302 from the local oscillator frequency used by the transmitter channel 100. In particular, this may be the case for an auxiliary receiver that, among other uses, is used to observe the transmit signal during periods where local oscillator cancellation algorithms are applied. As a result, the receiver channel 200 impairments (e.g., DC offset) are shifted in the frequency domain relative to the transmitter local oscillator leakage component 120, which is shown by frequency plot 320. In certain examples, the frequency offset may be achieved by using a separate and additional PLL for the receiver channel 200 during a period where a leakage suppression algorithm is running on the transmitter channel. That is, during periods where the leakage suppression algorithm is not running, the receiver channel 200 may be configured such that the receiver channel 200 receives signals using either a receiver local oscillator signal having a frequency equal to that of the transmitter local oscillator frequency or the transmitter local oscillator frequency as shown in FIG. 2.

As can be seen by the frequency plot 320, the receiver DC offset impairment is isolated from the transmitter local oscillator leakage component 120, which mitigates the need for complex signal processing to isolate the transmitter local oscillator leakage component 120 prior to applying a cancellation algorithm at the transmitter channel 100 to negate the transmitter local oscillator leakage component 120, as explained above with regard to FIGS. 1 and 2. By isolating the transmitter local oscillator leakage component 120 in the frequency domain away from the receiver 200 DC offset, DC estimations or tone power estimations may be more simply performed to quantify the transmitter local oscillator leakage component 120, which may be subsequently utilized in certain examples of the present disclosure to negate or cancel the transmitter local oscillator leakage component 120. In certain examples, the quantification of the transmitter local oscillator leakage component 120 may be referred to as a power of the leakage component 120, which may include an amplitude and phase component.

Figure 4:
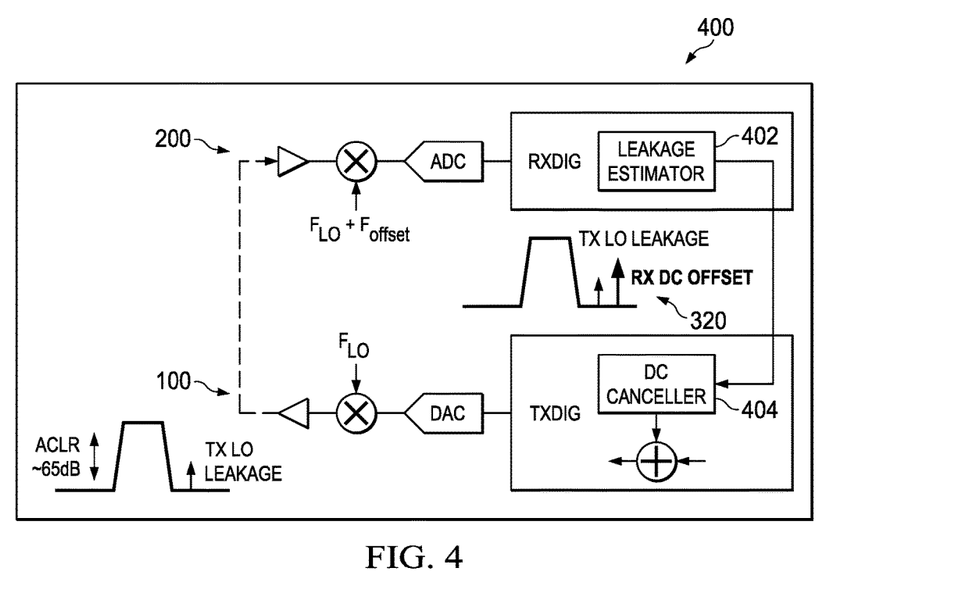
FIG. 4 shows a block diagram of a radio transceiver to estimate and/or cancel a transmitter local oscillator leakage component in accordance with various examples.

Turning to FIG. 4, a system 400 is shown in accordance with various examples. The system 400 includes a transmitter channel 100 that is configured to transmit data modulated using a transmitter local oscillator frequency, as explained above. Further, the transmitted signal includes a transmitter local oscillator leakage component 120. The system 400 also includes a receiver channel 200 that is configured to receive the transmitted signal from the transmitter channel 100. In accordance with various examples of the present disclosure, the receiver channel 200 utilizes a receiver local oscillator signal having a frequency offset from the frequency of the transmitter local oscillator, which isolates the transmitter local oscillator leakage component 120 from various receiver channel 200 impairments.

In FIG. 4, the receiver channel 200 may include an estimator 402, which may perform for example a quantitative estimation of the transmitter local oscillator leakage component 120. For example, diverse digital tone power estimation methods may be used to perform a quantitative estimation of the transmitter local oscillator leakage component 120 at an intermediate frequency. A DC estimation may be performed, where the TX carrier is digitally down-converted. Similarly, a tone power estimation may be performed using a fast Fourier transform (FFT) or similar known method to estimate a tone power. By separating the transmitter local oscillator leakage component 120 from a receiver DC offset in the frequency domain, the accuracy of the receiver channel 200 DC calibration is irrelevant and the non-linearities (or spurious responses) introduced by the receiver channel 200 data path will not contribute to the estimated amplitude of the transmitter local oscillator leakage component 120. Further, the use of a tone power estimation method is enabled, which is simple and faster relative to a DC estimation method. Additionally or alternatively, examples of the present disclosure may employ a DC estimation method to estimate the amplitude of the transmitter local oscillator leakage component 120 as well. However, because the transmitter local oscillator leakage component 120 is separated from the receiver DC offset, the DC estimation employed may require a lower accuracy, which is in turn less computationally intensive and requires fewer resources than attempting to carry out DC estimation when the transmitter local oscillator leakage component 120 is not separated from the receiver DC offset as in the prior art.

FIG. 4 also demonstrates an example in which a DC canceller 404 is utilized in the transmitter channel 100, which is responsive to the output of the transmitter local oscillator tone estimation 402. The DC canceller 404 may be, for example, an anti-DC injection circuit that utilizes a sigma-delta modulator for increased, sub-LSB resolution, as will be explained in further detail below with regard to FIG. 5. In some examples, the DC canceller 404 receives a digital representation of the transmitter local oscillator leakage power 120 from the estimator 402 as input.

Based on the received DC voltage value, the DC canceller 404 produces a DC output that is injected or added to the signal to be transmitted, which is to be up-converted to the local oscillator frequency, the up-converted DC cancellation signal leads to a deliberate transmitter local oscillator signal at the output with its amplitude being equal and its phase being opposite to that of the transmitter local oscillator leakage component 120, to cancel or negate the transmitter local oscillator leakage component 120 in the combined transmission signal. Thus, a closed loop exists between the DC canceller 404, the output of the transmitter channel 100, the input to the receiver channel 200, the output of the receiver channel 200 (which includes a receiver DC offset), the estimator 402, and the DC canceller 404.

In some examples, this closed feedback loop may be run continuously to implement a zero-forcing algorithm for the transmitter local oscillator leakage component 120. For example, this closed loop control may be implemented in a stochastic gradient-based adaptation, such as least mean squares (LMS). Notably, the described method of cancelling the transmitter local oscillator leakage component 120 does not require the use of test tones or similar methods and may be utilized during normal transmission (i.e., during regular use of the system 400 for wireless or cellular communications), and thus does not reduce throughput of the system 400. Further, by operating during normal transmission or run-time, any variation to the transmitter local oscillator leakage component 120 due to changes in operating conditions over time may be similarly tracked and eliminated.

In other examples, the closed feedback loop may run in a corrective fashion, for example where an observed amplitude of the transmitter local oscillator leakage component 120 drifts from a previous value by more than a predetermined amount. For example, monitoring logic 406 could be employed that is aware of the current output of the DC canceller 404, which will correspond to a previous value of the transmitter local oscillator leakage component 120 amplitude. The monitoring logic 406 is also aware of the current estimation of transmitter local oscillator leakage component 120 amplitude, as supplied by the estimator 402. If the monitoring logic 406 identifies a difference in these amplitudes greater than a predetermined amount, the monitoring logic 406 may cause the DC canceller 404 to update its output, or local oscillator leakage cancellation signal. The monitoring logic 406 also may perform the computation to receive the leakage power estimate from the leakage estimator 402 and cause the DC canceller 404 to output an appropriate local oscillator leakage cancellation signal, which is a complex DC value to control both the amplitude and phase cancellation signal. In certain examples, the monitoring logic 406 performs further processing on the received leakage power estimate from the leakage estimator 402, for example to account for or correct effects of the receiver channel 200 on the amplitude and phase of the leakage component 120.

Figure 5:
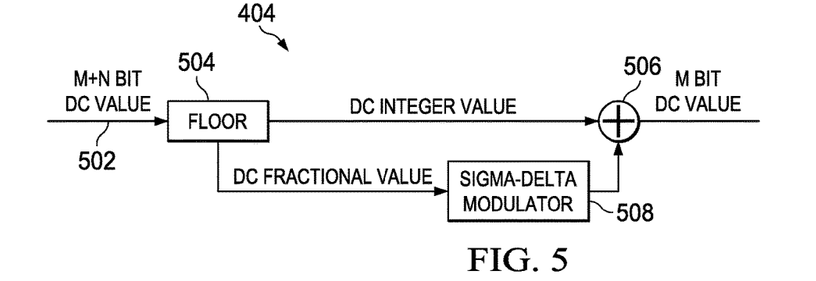
FIG. 5 shows an example block diagram of a DC cancellation circuit in accordance with various examples.

Turning now to FIG. 5, an example of the DC canceller 404 is shown in further detail. The DC canceller 404 receives a DC value 502 as input from the estimator 402 or from monitoring logic 406 as explained above. The DC value 502 is a digital signal and may be thought of as an integer number M of LSBs in the N-bit digital transmit signal path (e.g., N=16) and a decimal portion N denoting a sub-LSB fractional bit (e.g., N=[0, 1]), and thus represented as M+N. Conventionally, the resolution used in the digital logic domain of the transmitter and receiver channels 100, 200 is 16-bit, which is generally not sufficient to represent this DC value 502 with enough precision to ensure an appropriate reduction (e.g., greater than −70 dBm in some cases) in the transmitter local oscillator leakage component 120. The DC value 502 is supplied to a floor operator 504, which separates the integer portion M from the decimal portion N. The integer portion M is passed to an adder block 506, while the decimal portion N is passed to sigma-delta modulator block 508.

The output value sequence of the sigma-delta modulator block 508 consists of 0s and 1s, at a ratio such that the average output over time corresponds to the decimal portion N. For example, if the decimal portion N is equal to 0.6, then the output of the sigma-delta modulator block 508 will be, for example, on average, a 1 for six out of every ten cycles and a 0 for the remaining four out of every 10 cycles. This output is added back to the integer value M by the adder block 506. Thus, the output of the adder block 506, which is added to the transmitted signal, contains a least significant bit that is dithered such that the average DC value to be injected to the transmitted signal possesses a higher resolution than the bit length (in this example, 16-bit) of the transmitted signal. Of course, in other examples more than one least significant bit may be dithered, and the length of the transmitted signal (and output of the DC canceller 404) may be different than 16-bit. Regardless, this example implementation of the DC canceller 404 demonstrates that cancellation of the transmitter local oscillator leakage component 120 may be achieved with a higher resolution than that achievable based on the dynamic DAC range.

Figure 6A:
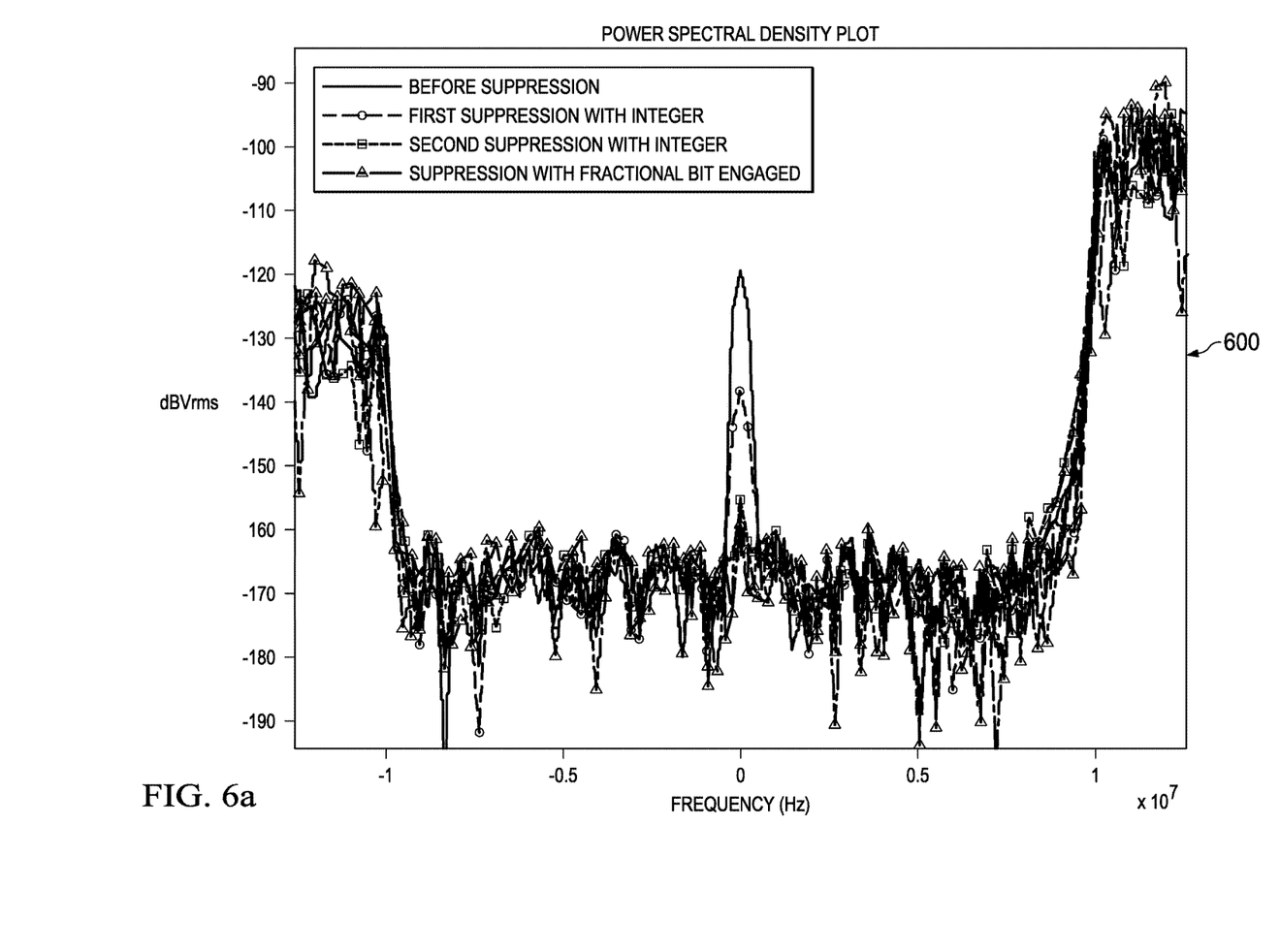
FIGS. 6a-6c show a variety of spectral plots that demonstrate a reduction in a local oscillator leakage component in accordance with various examples.

FIG. 6a shows a power spectral density plot 600. In the plot 600, four different scenarios are shown: before any transmitter local oscillator leakage 120 suppression is applied, first and second suppressions using only an integer value output from the DC canceller 404, and a suppression with a fractional output from the DC canceller 404 using the dithering scheme described above. As can be seen, by employing the above system for isolating the transmitter local oscillator leakage component 120, which is then more easily and quickly quantified, and injecting a local oscillator leakage cancellation signal to future transmissions based on the quantification, a drastic reduction in the leakage component may be achieved.

Figure 6B:
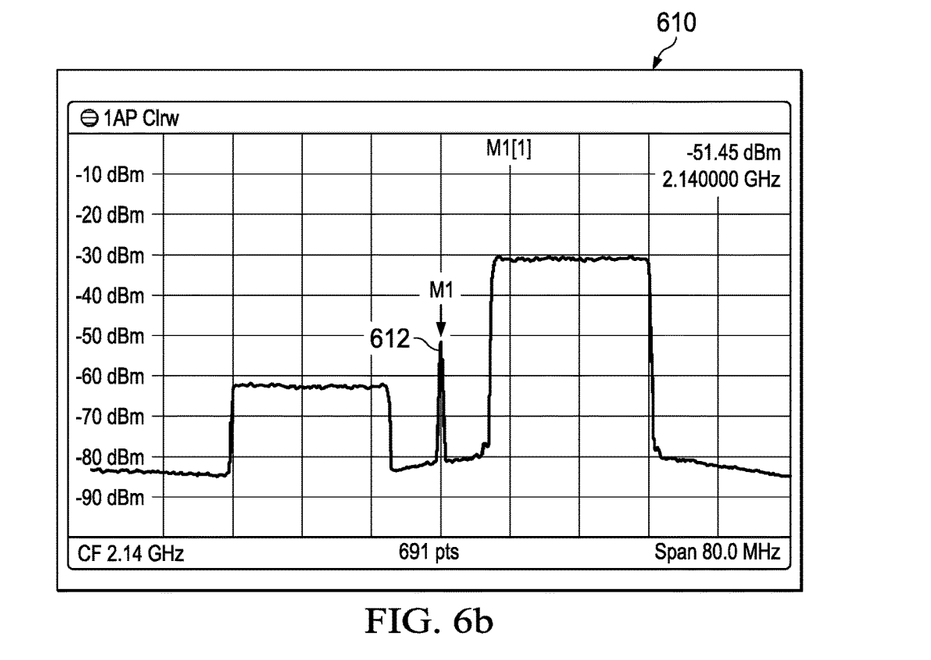
Figure 6C:
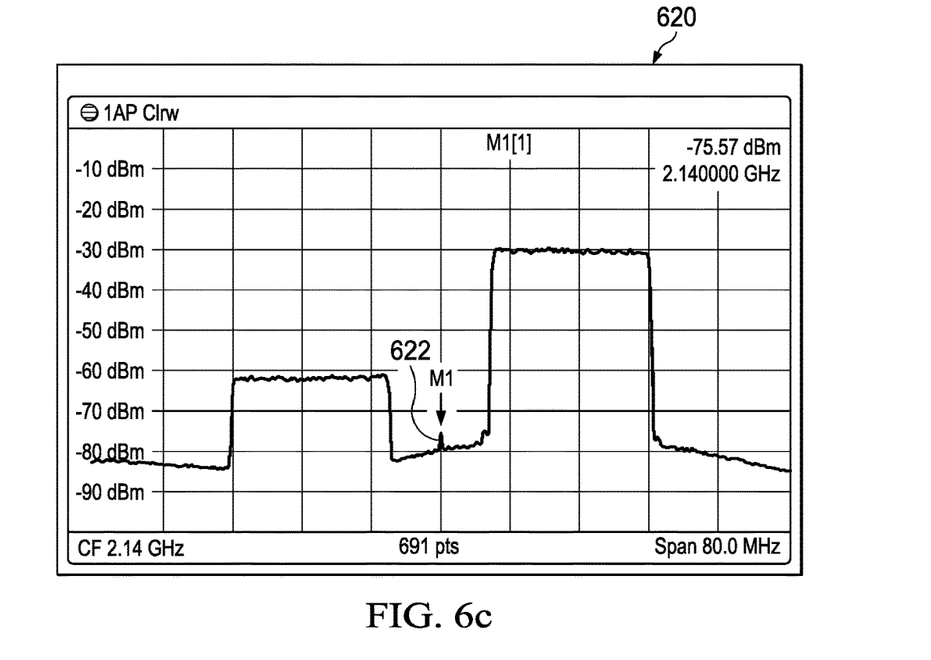

FIGS. 6b and 6c show similar power spectrums 610, 620. Spectrum 610 demonstrates the prevalence 612 of the leakage component 120 before any leakage compensation is applied. Spectrum 620 demonstrates a reduction 622 to below −70 dBm that is achieved after one or more portions of the above-described leakage compensation system is applied.

Figure 7A:
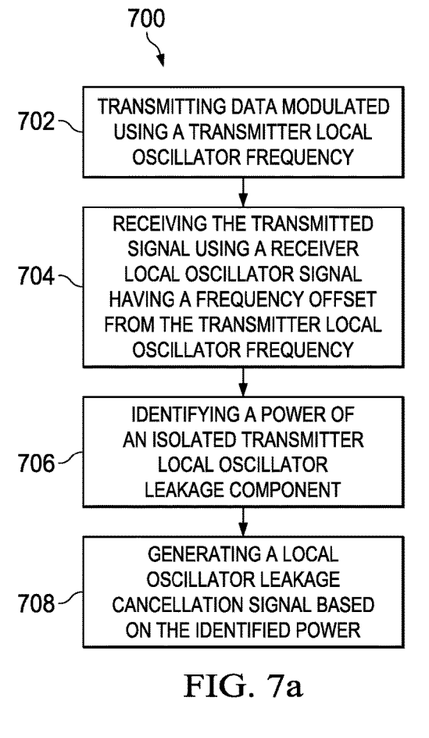
FIGS. 7a-7c show flow charts of methods for reducing a local oscillator leakage component in accordance with various examples.

FIG. 7a shows a flow chart of a method 700 in accordance with various examples of the present disclosure. The method 700 begins in block 702 with transmitting data modulated using a transmitter local oscillator frequency. As explained above, the transmitted signal includes a transmitter local oscillator leakage component. The leakage component can cause the transmission to become corrupted on the receiver side, for example a mobile device receiving a signal from the wireless base station. To reduce the leakage component, the method 700 continues in block 704 with receiving the transmitted signal using a receiver local oscillator signal having a frequency offset from the transmitter local oscillator frequency. By utilizing a different frequency on the receiver end for demodulation, the received signal includes the transmitter local oscillator leakage component, however it is isolated from one or more receiver impairments such as DC offset described above. By separating the transmitter local oscillator leakage component from other receiver impairments in the frequency domain, estimating the leakage power for a subsequent cancellation algorithm becomes simpler.

The method 700 continues then in block 706 with identifying a power of the isolated transmitter local oscillator leakage component. As explained above, this may be performed using tone power estimation, DC estimation, or other similar techniques. However, because the transmitter local oscillator leakage component is isolated from other receiver impairments, the estimation is much simpler and may be performed without requiring such a high accuracy. The method 700 further continues in block 708 with generating a local oscillator leakage cancellation signal based on the identified power from block 706. For example, the DC canceller 404 produces a DC output that is injected or added to the signal to be transmitted, which is to be up-converted to the local oscillator frequency. As a result, the up-converted DC cancellation signal leads to a deliberate transmitter local oscillator signal at the output with its amplitude being equal and its phase being opposite to that of the transmitter local oscillator leakage component, and transmitter local oscillator leakage component is cancelled or negated in the combined transmission signal. In some examples, the method 700 includes continually generating the local oscillator leakage cancellation signal in block 708, even where the transmitter channel of the transceiver is operating in a normal mode (e.g., where the transceiver is transmitting data during normal use, such as cellular or other wireless data activity).

Figure 7B:
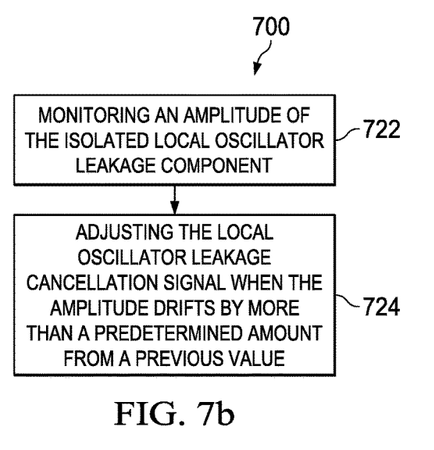

FIG. 7b shows additional portions of the method 700. For example, the method 700 may include monitoring an amplitude of the isolated local oscillator leakage component in block 722. As explained above, the leakage cancellation algorithm may run continuously; however, this need not be the case. Once the leakage cancellation algorithm is run, the method 700 may include in block 724 adjusting the local oscillator leakage cancellation signal when the amplitude observed in block 722 drifts by more than a predetermined amount from a previous value. In this way, processing resources are conserved while ensuring that the local oscillator leakage component does not exceed a predetermined threshold. This also allows compensation for drift caused by operating conditions, but with a reduced processing demand.

Figure 7C:
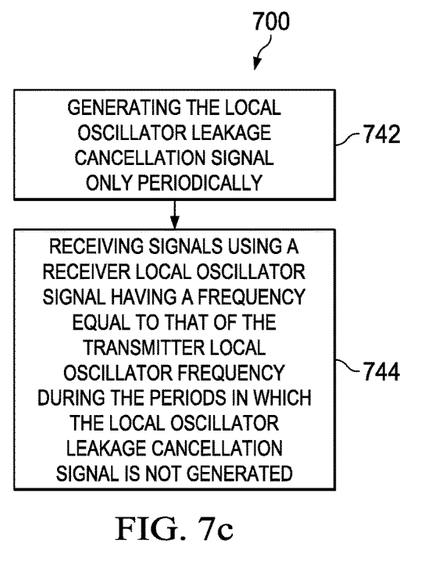

FIG. 7c shows further portions of the method 700. In block 742, the method 700 includes generating the local oscillator leakage cancellation signal only periodically. As in FIG. 7b, this may be done to reduce processing requirements, for example. In block 744, the method 700 includes receiving signals using a receiver local oscillator signal having a frequency equal to that of the transmitter local oscillator frequency during the periods in which the local oscillator leakage cancellation signal is not generated.

Some of the methods and processes described above, including all or some of the functionality provided by the estimator 402, the monitoring logic 406, and the DC canceller 404 can be performed by a processor. The term "processor" should not be construed to limit the disclose examples to any particular device type or system. The processor may include a computer system. The computer system may also include a computer processor (e.g., a microprocessor, microcontroller, digital signal processor, or general purpose computer) for executing any of the methods and processes described above.

The computer system may further include a memory such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device.

Some of the methods and processes described above, as listed above, can be implemented as computer program logic for use with the computer processor. The computer program logic may be embodied in various forms, including a source code form or a computer executable form. Source code may include a series of computer program instructions in a variety of programming languages (e.g., an object code, an assembly language, or a high-level language such as C, C++, or JAVA). Such computer instructions can be stored in a non-transitory computer-readable medium (e.g., memory) and executed by the computer processor. The computer instructions may be distributed in any form as a removable storage medium, preloaded with a computer system (e.g., on system ROM or fixed disk), or distributed from a server over a communication system (e.g., the Internet or World Wide Web).

Alternatively or additionally, the processor may include discrete electronic components coupled to a printed circuit board, integrated circuitry (e.g., Application Specific Integrated Circuits (ASIC)), and/or programmable logic devices (e.g., a Field Programmable Gate Arrays (FPGA)). Any of the methods and processes described above can be implemented using such logic devices.

The above discussion is meant to be illustrative of the principles and various examples of the present invention. Numerous variations and modifications will become apparent to those skilled in the art once the above disclosure is fully appreciated. It is intended that the following claims be interpreted to embrace all such variations and modifications.

What is claimed is:

1. A system for reducing a local oscillator leakage component, comprising:
   a transmitter signal path configured to transmit a signal, the transmitted signal including data modulated using a transmitter local oscillator signal having a transmitter local oscillator frequency and further including a transmitter local oscillator leakage component;
   a receiver signal path configured to receive the transmitted signal, data associated with the received signal demodulated using a receiver local oscillator signal having a frequency that is offset by a pre-defined amount from the transmitter local oscillator frequency, wherein the demodulated data includes the transmitter local oscillator leakage component at a frequency equal to the frequency offset between the transmitter local oscillator signal and the receiver local oscillator signal; and
   a feedback loop from the receiver signal path to the transmitter signal path, the feedback loop configured to provide an indication of a signal strength of the transmitter local oscillator leakage component at the offset frequency and to provide a feedback signal to the transmit signal path based on the signal strength of the transmitter local oscillator leakage component at the offset frequency.

2. The system of claim 1, wherein the feedback loop comprises a tone estimator or a DC estimator to provide the indication of the signal strength, and an indication of a phase, of the transmitter local oscillator leakage component.

3. The system of claim 2, wherein the receiver signal path is further configured to isolate the transmitter local oscillator leakage component corresponding to the demodulated received signal from one or more impairments of the receiver signal path, the transmitter local oscillator leakage component isolated by using the frequency offset between the transmitter local oscillator signal and the receiver local oscillator signal, and wherein the one or more receiver signal path impairments comprise at least one of: a receiver signal path direct current offset value and a receiver signal path non-linearity or spurious response value.

4. The system of claim 1, wherein the feedback loop comprises a direct current canceller circuit to generate a local oscillator leakage cancellation signal for reducing the transmitter local oscillator leakage component, the local oscillator leakage cancellation signal generated based on the signal strength of the transmitter local oscillator leakage component at the offset frequency.

5. The system of claim 1, wherein the feedback loop operates continually during a normal transmission mode of the transmitter signal path.

6. The system of claim 4, further comprising:
   monitoring logic to monitor the signal strength of the transmitter local oscillator leakage component, wherein the local oscillator leakage cancellation signal is adjusted when the signal strength drifts by more than an amount from a previous value.

7. The system of claim 4, wherein the feedback loop is further configured to generate the local oscillator leakage cancellation signal periodically such that the receiver signal path demodulates the received signal using the receiver local oscillator signal having a frequency that is offset from that of the transmitter local oscillator frequency during a time period when the local oscillator leakage cancellation signal is being generated and demodulates the received signal using the receiver local oscillator signal having a frequency equal to that of the transmitter local oscillator frequency during a time period when the local oscillator leakage cancellation signal is not being generated.

8. A method for reducing a local oscillator leakage component generated by a transmitter signal path, the method comprising:
   transmitting a signal including data modulated using a transmitter local oscillator signal having a transmitter local oscillator frequency, wherein the transmitted signal includes a transmitter local oscillator leakage component;
   receiving the transmitted signal, data associated with the received signal demodulated using a receiver local oscillator signal having a frequency that is offset by a pre-defined amount from the transmitter local oscillator frequency, wherein the demodulated data includes the transmitter local oscillator leakage component at a frequency equal to the frequency offset between the transmitter local oscillator signal and the receiver local oscillator signal;
   providing an indication of a signal strength of the transmitter local oscillator leakage component at the offset frequency; and
   providing a feedback signal to the transmit signal path based on the signal strength of the transmitter local oscillator leakage component at the offset frequency.

9. The method of claim 8, wherein the indication of the signal strength, and an indication of a phase, of the transmitter local oscillator leakage component at the offset frequency is provided by a tone estimator or a DC estimator.

10. The method of claim 8, wherein the transmitter local oscillator leakage component corresponding to the demodulated received signal is isolated from one or more impairments of the receiver signal path by using the frequency offset between the between the transmitter local oscillator signal and the receiver local oscillator signal, and wherein the one or more receiver signal path impairments comprise at least one of: a receiver signal path direct current offset value and a receiver signal path non-linearity or spurious response value.

11. The method of claim 8, further comprising:
   generating a local oscillator leakage cancellation signal by a direct current canceller circuit for reducing the transmitter local oscillator leakage component, the local oscillator leakage cancellation signal generated based on the signal strength of the transmitter local oscillator leakage component at the offset frequency.

12. The method of claim 11, wherein the local oscillator leakage cancellation signal is generated continually during a normal transmission mode of the transmitter signal path.

13. The method of claim 11 further comprising:
   monitoring the signal strength of the transmitter local oscillator leakage component; and
   adjusting the local oscillator leakage cancellation signal when the signal strength drifts by more than an amount from a previous value.

14. The method of claim 11 further comprising:
   generating the local oscillator leakage cancellation signal periodically, wherein the received signal is demodulated using the receiver local oscillator signal having a frequency that is offset from that of the transmitter local oscillator frequency while the local oscillator leakage cancellation signal is being generated and wherein the received signal is demodulated using the receiver local oscillator signal having a frequency equal to that of the transmitter local oscillator frequency while the local oscillator leakage cancellation signal is not being generated.

15. A system for reducing a local oscillator leakage component, comprising:
   a transmitter signal path configured to transmit a signal, the transmitted signal including data modulated using a transmitter local oscillator signal having a transmitter local oscillator frequency and further including a transmitter local oscillator leakage component;
   a receiver signal path configured to receive the transmitted signal, data associated with the received signal demodulated using a receiver local oscillator signal having a frequency that is offset by a predefined amount from the transmitter local oscillator frequency, wherein the demodulated data includes the transmitter local oscillator leakage component at a frequency equal to the frequency offset between the transmitter local oscillator signal and the receiver local oscillator signal; and
   a feedback loop from the receiver signal path to the transmitter signal path, the feedback loop configured to provide an indication of a signal strength of the transmitter local oscillator leakage component at the offset frequency.

16. The system of claim 15, wherein the feedback loop comprises a tone estimator or a DC estimator to provide the indication of the signal strength, and an indication of a phase, of the transmitter local oscillator leakage component and wherein the feedback loop is further configured to provide a feedback signal to the transmit signal path based on the signal strength of the transmitter local oscillator leakage component at the offset frequency.

17. The system of claim 15, wherein the feedback loop comprises a direct current canceller circuit to generate a local oscillator leakage cancellation signal for reducing the transmitter local oscillator leakage component, the local oscillator leakage cancellation signal generated based on the signal strength of the transmitter local oscillator leakage component at the offset frequency.

18. The system of claim 15, wherein the feedback loop operates continually during a normal transmission mode of the transmitter signal path.

19. The system of claim 17, further comprising:
   monitoring logic to monitor the signal strength of the transmitter local oscillator leakage component, wherein the local oscillator leakage cancellation signal is adjusted when the signal strength drifts by more than an amount from a previous value.

20. The system of claim 17, wherein the feedback loop is further configured to generate the local oscillator leakage cancellation signal periodically such that the receiver signal path demodulates received signal using the receiver local oscillator signal having a frequency that is offset from that of the transmitter local oscillator frequency during a time period when the local oscillator leakage cancellation signal is being generated and demodulates received signal using the receiver local oscillator signal having a frequency equal to that of the transmitter local oscillator frequency during a time period when the local oscillator leakage cancellation signal is not being generated.

* * * * *